(12) United States Patent
Webster (10) Patent No.: US 9,209,320 B1
(45) Date of Patent: Dec. 8, 2015

(54) METHOD OF FABRICATING A SINGLE PHOTON AVALANCHE DIODE IMAGING SENSOR

(71) Applicant: OMNIVISION TECHNOLOGIES, INC., Santa Clara, CA (US)

(72) Inventor: Eric A. G. Webster, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/454,460

(22) Filed: Aug. 7, 2014

(51) Int. Cl.
*H01L 31/02* (2006.01)
*H01L 27/146* (2006.01)

(52) U.S. Cl.
CPC .... *H01L 31/02027* (2013.01); *H01L 27/14685* (2013.01)

(58) Field of Classification Search
CPC ............ H01L 31/02027; H01L 31/107; H01L 31/1075; H01L 27/1446; H01L 31/18; H01L 27/14643; G01J 1/44; Y02E 10/50
See application file for complete search history.

(56) References Cited

U.S. PATENT DOCUMENTS

| | | | |
|---|---|---|---|
| 5,831,322 A * | 11/1998 | Dabrowski | ........ H01L 27/14643 257/438 |
| 8,981,516 B2 | 3/2015 | Prima et al. | |
| 2008/0079045 A1 | 4/2008 | Bahl et al. | |
| 2009/0065831 A1 | 3/2009 | Lee | |
| 2010/0148039 A1 | 6/2010 | Gratz et al. | |
| 2011/0024768 A1 | 2/2011 | Veliadis | |
| 2011/0284927 A1 | 11/2011 | Achouche | |
| 2013/0030763 A1* | 1/2013 | Mazzillo | ................... G01J 1/44 702/179 |
| 2013/0193546 A1 | 8/2013 | Webster et al. | |
| 2014/0054737 A1 | 2/2014 | Okino et al. | |
| 2014/0077385 A1 | 3/2014 | Harper | |
| 2014/0103196 A1 | 4/2014 | Soga et al. | |

OTHER PUBLICATIONS

U.S. Appl. No. 14/156,053—Non-Final Office Action, mailed Apr. 14, 2015, pp. 1-24.
U.S. Appl. No. 14/156,053, filed Jan. 1, 2014, Webster.
U.S. Appl. No. 14/156,053—Final Office Action, mailed Sep. 16, 2015, 29 pages.

* cited by examiner

*Primary Examiner* — Kevin Parendo
*Assistant Examiner* — Wasiul Haider
(74) *Attorney, Agent, or Firm* — Blakely Sokoloff Taylor & Zafman LLP (57) ABSTRACT

A method of fabricating an avalanche photodiode pixel includes growing a second doped semiconductor layer on a first doped semiconductor layer having a first doping concentration. The second doped semiconductor layer is grown with a second doping concentration and is of an opposite majority charge carrier type as the first doped semiconductor layer. A doped contact region having a third doping concentration is formed in the second doped semiconductor layer between the doped contact region and the first doped semiconductor layer. The doped contact region is of a same majority charge carrier type as the second doped semiconductor layer. The third doping concentration is greater than the second doping concentration. A guard ring region is formed in the second doped semiconductor layer, is of an opposite majority charge carrier type as the second doped semiconductor layer, and extends through the second doped semiconductor layer surrounding the doped contact region.

23 Claims, 7 Drawing Sheets

METHOD OF FABRICATING A SINGLE PHOTON AVALANCHE DIODE IMAGING SENSOR

REFERENCE TO RELATED APPLICATION(S)

This application is related to co-pending application Ser. No. 14/156,053, filed Jan. 15, 2014, entitled "BACK SIDE ILLUMINATED SINGLE PHOTON AVALANCHE DIODE IMAGING SENSOR WITH HIGH SHORT WAVELENGTH DETECTION EFFICIENCY," and assigned to the Assignee of the present application.

BACKGROUND INFORMATION

1. Field of the Disclosure

This disclosure relates generally to photodiode fabrication, and in particular but not exclusively, relates to avalanche photodiode image sensor fabrication.

2. Background

Image sensors have become ubiquitous. They are widely used in digital still cameras, cellular phones, security cameras, as well as, medical, automobile, and other applications. The technology used to manufacture image sensors, has continued to advance at great pace. For example, the demands of higher resolution and lower power consumption have encouraged the further miniaturization and integration of these image sensors.

One type of photodetector that may be used in an image sensor or in a light detector is a single photon avalanche diode (SPAD). A SPAD (also referred to as a Geiger-mode avalanche photodiode (GM-APD)) is a solid-state photodetector capable of detecting a low intensity signal, such as a single photon. SPAD imaging sensors are semiconductor photosensitive devices made up of an array of SPAD regions that are fabricated on a silicon substrate. The SPAD regions produce an output current pulse when struck by a photon. The SPAD regions have a p-n junction that is reverse biased above the breakdown voltage such that a single photo-generated carrier can trigger an avalanche multiplication process that causes current at the output of the photon detection cell to reach its final value quickly. This avalanche current continues until a quenching element is used to quench the avalanche process by reducing the bias voltage. The intensity of the photon signal received by the image sensor is obtained by counting the number of these output pulses within a window of time.

Among the challenges faced when sensing photons is achieving high blue detection efficiency with back side illuminated (BSI) SPADs. For instance, in a BSI image sensor, the back surface may include implants that have defects that require laser annealing. These defects can cause a SPAD device not to sustain the required electric fields. In addition, SPAD devices with these defects may be noisy and consequently suffer from poor performance.

BRIEF DESCRIPTION OF THE DRAWINGS

Non-limiting and non-exhaustive examples of the invention are described with reference to the following figures, wherein like reference numerals refer to like parts throughout the various views unless otherwise specified.

DETAILED DESCRIPTION

Examples of a method for fabricating an avalanche diode imaging sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "an embodiment" means that a particular feature, structure, or characteristic described in connection with the example is included in at least one embodiment of the present invention. Thus, the appearances of the phrases "in one example" or "in an embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

Figure 1:
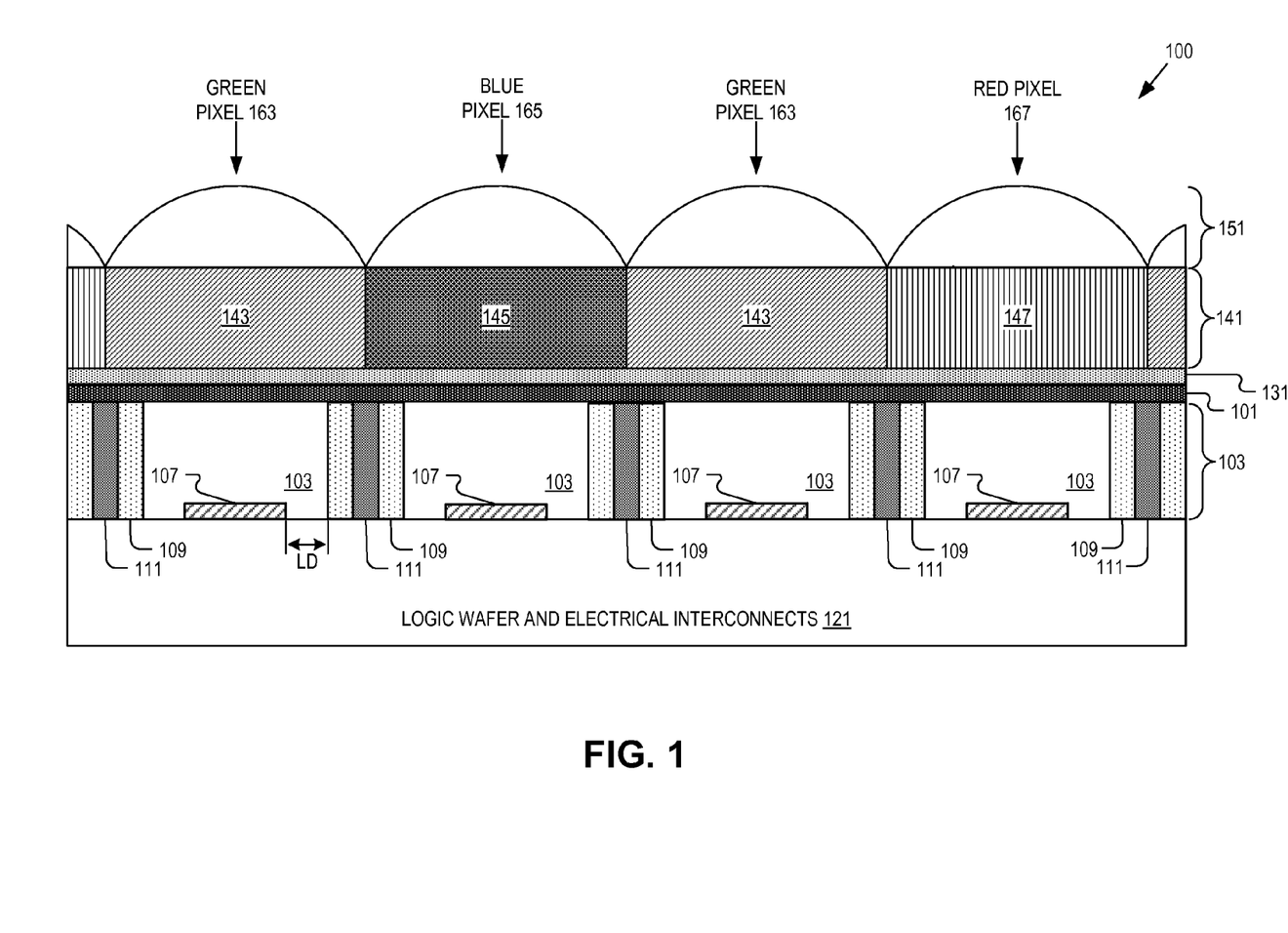
FIG. 1 is a cross sectional view of one example of a single photon avalanche diode (hereinafter "SPAD") imaging sensor, in accordance with the teachings of the present invention.

FIG. 1 is a cross sectional view of one example of a single photon avalanche diode (hereinafter "SPAD") image sensor 100 (hereinafter "image sensor 100"), in accordance with the teachings of the present invention. In one example, image sensor 100 is created by forming a first doped semiconductor layer 101, which is grown with a first doping concentration, on a substrate (not shown). In one example, first doped semiconductor layer 101 includes p-doped silicon with dopant atoms such as boron or the like.

A second doped semiconductor layer 103 is formed on first doped semiconductor layer 101. Second doped semiconductor layer 103 is grown with a second doping concentration, and is of an opposite majority charge carrier type as the first doped semiconductor layer 101. In one example, second doped semiconductor layer 103 includes n-doped silicon with dopant atoms such as arsenic, phosphorus, or the like.

In one example, both first doped semiconductor layer 101 and second doped semiconductor layer 103 are formed by epitaxial growth. During epitaxial growth, semiconductor and dopant materials may be deposited at the same time to form low-defect concentration semiconductor layers. First doped semiconductor layer 101 and second doped semiconductor layer 103 may be fabricated using chemical vapor deposition (CVD), atomic layer deposition (ALD), molecular beam epitaxy (MBE), or the like. In one example, process materials may include (1) silicon-based gases such as silicon tetrachloride to form the bulk semiconductor layers, (2)

boron-based gases such as boron triflouride to form p-type substitutional atoms, and (3) phosphorus or arsenic-based gasses such as phosphine or arsine to form n-type substitutional atoms. However, in alternate examples, other solid state or liquid precursors may be used. Forming SPADs via epitaxial growth results in high performance SPAD devices since no ion implantation is used to form the multiplication junction. Ion implantation techniques may damage the multiplication junction as individual ions may produce point defects in the target crystal on impact such as vacancies and interstitials.

Following fabrication of second doped semiconductor layer 103, a plurality of avalanche photodiode pixels are formed. The plurality of avalanche photodiode pixels include a doped contact region 107 disposed in second doped semiconductor layer 103. Doped contact region 107 is of a same majority charge carrier type as second doped semiconductor layer 103 (e.g. n-type) and has a greater doping concentration than second doped semiconductor layer 103. In one example, doped contact region 107 is fabricated via an ion implantation process.

Additionally, a guard ring region 109 is formed in second doped semiconductor layer 103. Guard ring region 109 is of an opposite majority charge carrier type as second doped semiconductor layer 103 (e.g. p-type), and separates individual pixels in the plurality of avalanche photodiode pixels. Additionally, a second doped contact region 111 may be formed within guard ring region 109 and second doped contact region 111 is of a same majority charge carrier type as guard ring region 109 (e.g. p-type). However, the doping concentration of second doped contact region 111 is greater than the doping concentration of guard ring region 109.

A logic wafer 121 is connected to second doped semiconductor layer 103, such that second doped semiconductor layer 103 is disposed between logic wafer 121 and first doped semiconductor layer 101. In one example, logic wafer 121 includes control circuitry (e.g. control circuitry 420) and readout circuitry (e.g. readout circuitry 410) or parts of control circuitry and readout circuitry. Logic wafer 121 may also contain conductive interconnects that may be connected to individual SPADs.

In one example, after connecting logic wafer 121, a substrate (not depicted), attached to first doped semiconductor layer, 101 is removed. Additionally, first doped semiconductor layer 101 is thinned to a thickness that is less than an original thickness. The thickness is such that photons incident on a multiplication junction defined at an interface between first doped semiconductor layer 101 and second doped semiconductor layer 103 are converted to a measurable electric current.

In one example, an optical stack is formed. Creating an optical stack may consist of forming an antireflection coating 131 disposed on first doped semiconductor layer 101, and forming a microlens layer 151 such that antireflection coating 131 is disposed between first doped semiconductor layer 101 and microlens layer 151. In one example, microlens layer 151 includes photoresist. Additionally, an optional color filter layer 141 may be formed, such that color filter layer 141 is disposed between antireflection coating 131 and microlens layer 151. Color filter layer 141 may include red color filters 147, green color filters 143, and blue color filters 145, these may be arranged into a Bayer Pattern, X-Trans Pattern, EXR Pattern, or the like. However, in one example color filter layer 141 may be omitted, and microlens layer 151 may be formed on antireflection coating 131.

FIGS. 2A-2F show a method of fabricating a SPAD pixel, such as for example the pixels described above in FIG. 1, in accordance with the teachings of the present invention. The order in which some or all of the process occurs should not be deemed limiting. Rather, one of ordinary skill in the art having the benefit of the present disclosure will understand that some of the process may be executed in a variety of orders not illustrated, or even in parallel.

Figure 2A:
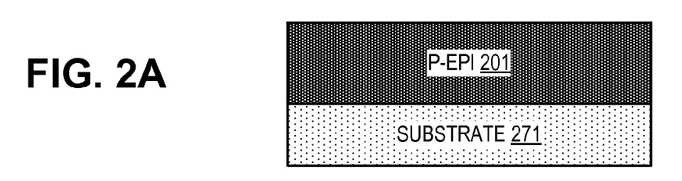
FIGS. 2A-2F show a process for forming a SPAD pixel, in accordance with the teachings of the present invention.

FIG. 2A illustrates forming a first doped semiconductor layer 201 on a substrate 271. First doped semiconductor layer 201 is grown with a first doping concentration. In one example, first doped semiconductor layer 201 is p-type silicon and includes dopant atoms such as boron. However, in a different example, first doped semiconductor layer 201 may be n-type and include dopant atoms such as arsenic or phosphorus. First doped semiconductor layer 201 may be epitaxially grown on substrate 271. In order to ensure high-quality crystal growth of first doped semiconductor layer 201, substrate 271 is made from a material that has a similar lattice constant as first doped semiconductor layer 201. For example, if first doped semiconductor layer 201 includes silicon, substrate 271 may include, for example, silicon, silicon oxide, or metal oxide (e.g. sapphire). Additionally, first doped semiconductor layer may be fabricated using chemical vapor deposition (CVD), atomic layer deposition (ALD), molecular beam epitaxy (MBE), or the like. During any of these processes, both semiconductor and dopant precursor may be deposited at the same time to form first doped semiconductor layer 201.

Figure 2B:
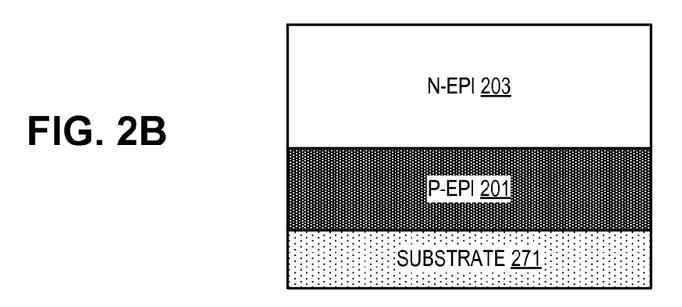

FIG. 2B illustrates forming a second doped semiconductor layer 203 with a second doping concentration, on first doped semiconductor layer 201. Both first doped semiconductor layer 201 and second doped semiconductor layer 203 may be formed by epitaxial growth, and may both be grown on substrate 271. Second doped semiconductor layer 203 is of an opposite majority charge carrier type as the first doped semiconductor layer 201. In one example, first doped semiconductor layer 201 is p-type silicon whereas second doped semiconductor layer 203 is n-type silicon. Similarly to first doped semiconductor layer 201, second doped semiconductor layer may be fabricated using chemical vapor deposition (CVD), atomic layer deposition (ALD), molecular beam epitaxy (MBE), or the like. During any of these processes, both semiconductor and dopant precursor may be deposited at the same time to form second doped semiconductor layer 203.

However, in another example (not depicted), second doped semiconductor layer 203 could be grown on a preexisting wafer/semiconductor layer rather than the epitaxially grown first doped semiconductor layer 201. Like first doped semiconductor layer 201, the preexisting wafer/semiconductor layer would be of an opposite majority charge carrier type as second doped semiconductor layer 203, and thus would still form a p-n junction with second doped semiconductor layer 203.

Figure 2C:
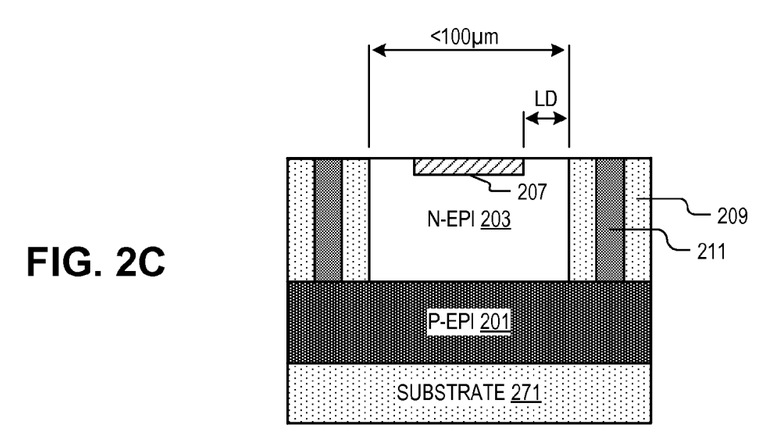

FIG. 2C shows forming a doped contact region 207, having a third doping concentration, in second doped semiconductor layer 203. Second doped semiconductor layer 203 is disposed between doped contact region 207 and first doped semiconductor layer 201. Doped contact region 207 is of a same majority charge carrier type as second doped semiconductor layer 203 (e.g. n-type), but has a greater doping concentration than second doped semiconductor layer 203. In one example, first doped semiconductor layer 201 is p-type, second doped semiconductor layer 203 is n-type, and doped contact region 207 is n-type. However, in a different example, the majority charge carrier type of these three layers/regions may be reversed. For instance, in another example, first doped semiconductor layer 201 is n-type, second doped semiconductor layer 203 is p-type, and doped contact region 207 is p-type Additionally, FIG. 2C illustrates forming a guard ring region 209 in second doped semiconductor layer 203. Guard ring region 209 is of an opposite majority charge carrier type as second doped semiconductor layer 203 and guard ring region 209 extends through second doped semiconductor layer 203. Guard ring region 209 surrounds doped contact region 207 but is separated from doped contact region 207 by a lateral distance. Within guard ring region 209, a second doped contact region 211 is formed. Second doped contact region 211 is of a same majority charge carrier type as guard ring region 209; however, the doping concentration of second doped contact region 211 is greater than a doping concentration of guard ring region 209

Figure 2D:
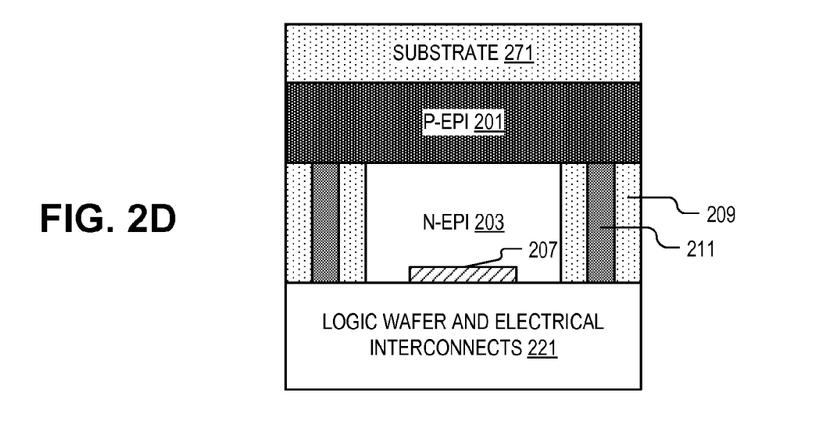

FIG. 2D shows a logic wafer 221 being attached to second doped semiconductor layer 203. Second doped semiconductor layer 203 is disposed between first doped semiconductor layer 201 and logic wafer 221. Electrical interconnects are contained in logic wafer 221 and may be bonded to individual SPADs. In one example, logic wafer 221 includes control circuitry and readout circuitry, which are discussed in further detail below.

Figure 2E:
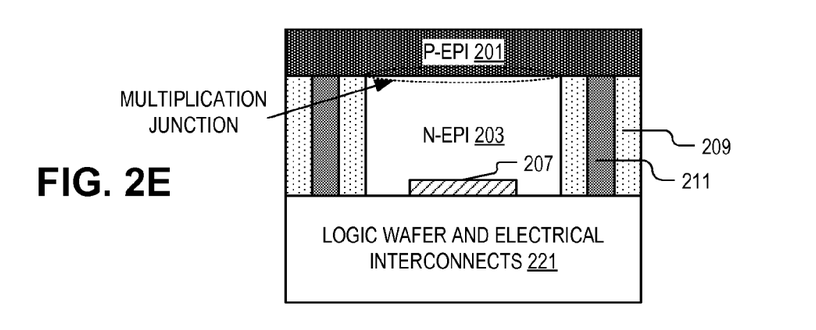

FIG. 2E illustrates removing substrate 271 and thinning first doped semiconductor layer 201 to a thickness that is less than an original thickness. The thickness is such that photons incident on a multiplication junction defined at an interface between first doped semiconductor layer 201 and second doped semiconductor layer 203 are converted to a measurable electric charge.

Figure 2F:
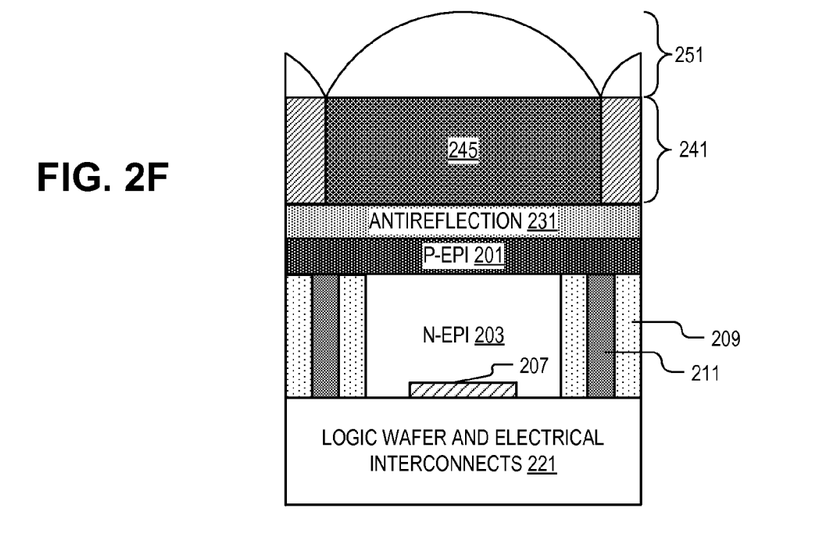

FIG. 2F shows fabrication of the optical stack. An antireflection coating 231 may be formed on first doped semiconductor layer 201. A microlens layer 251 may also be fabricated proximate to antireflection coating 231, such that antireflection coating 231 is disposed between first doped semiconductor layer 201 and microlens layer 251. In one example, microlens layer 251 may include photoresist.

In one example, a color filter layer 241 may be formed such that color filter layer 241 is disposed between antireflection coating 231 and microlens layer 251. Color filter layer 241 may be arranged into a Bayer Pattern, X-Trans Pattern, EXR Pattern, or the like.

Figure 3:
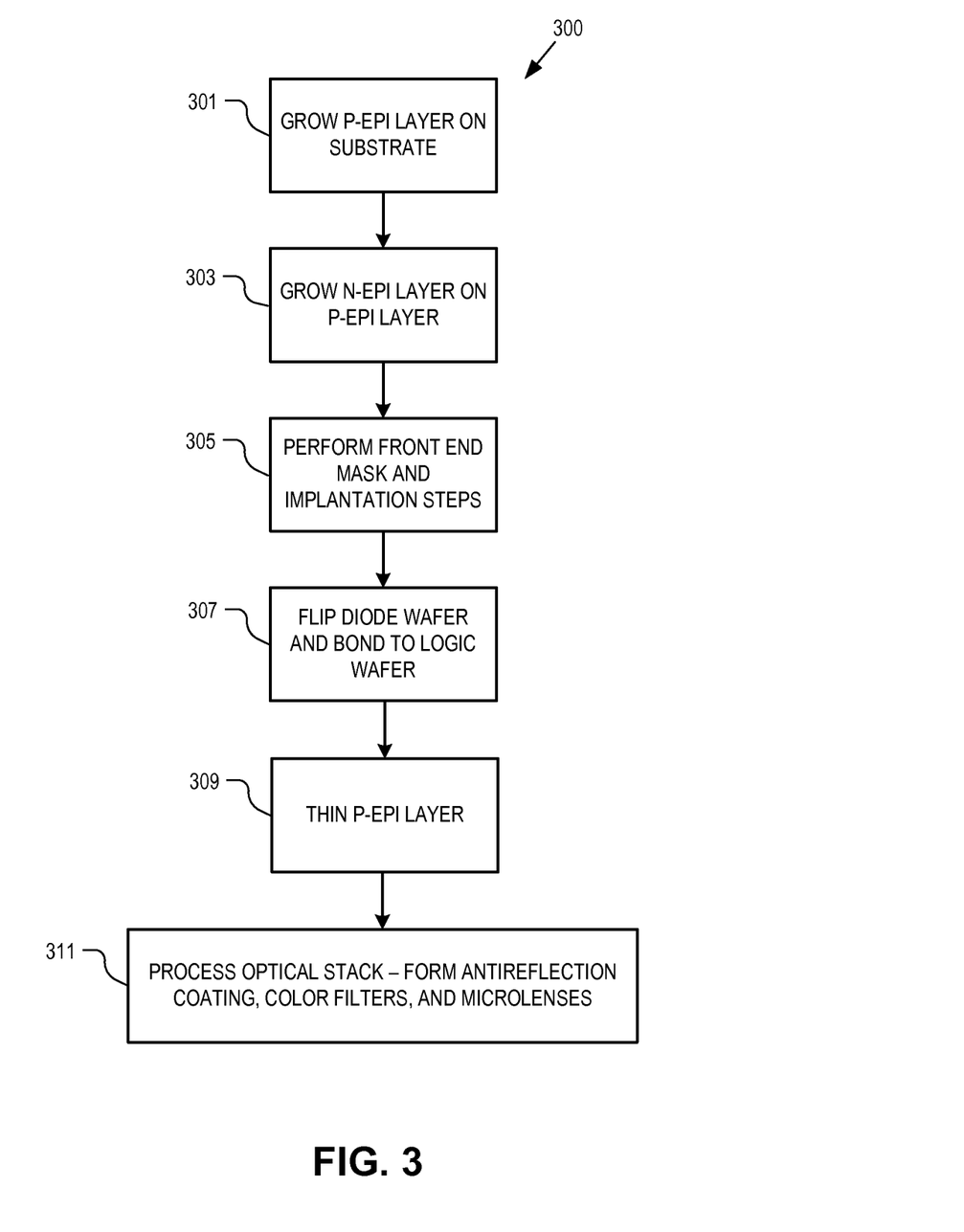
FIG. 3 is a flowchart of a process for forming a SPAD pixel, in accordance with the teachings of the present invention.

FIG. 3 is a flowchart of a process 300 for forming a SPAD pixel, such as for example the pixels described above in FIGS. 1-2, in accordance with the teachings of the present invention. The order in which some or all of the process blocks appear in process 300 should not be deemed limiting. Rather, one of ordinary skill in the art having the benefit of the present disclosure will understand that some of the process blocks may be executed in a variety of orders not illustrated, or even in parallel.

Process block 301 shows growing a p-type epitaxial layer (e.g. first doped semiconductor layer 101) on a substrate. In one example, the substrate may include a semiconductor or semiconductor oxide such as silicon, silicon oxide, SiGe, Ge, or InGaAsP; however, in a different example, the substrate may include a metal oxide such as sapphire. The p-type epitaxial layer may include a semiconductor such as silicon, germanium, or the like. During the growth process, dopant atoms are deposited at the same time as the semiconductor source material. Accordingly, dopant is homogeneously included in the semiconductor layer and therefore does not require a subsequent step of ion implantation of dopant into the p-type epitaxial layer. In one example, dopant atoms include boron. The p-type epitaxial layer may be fabricated using chemical vapor deposition (CVD), atomic layer deposition (ALD), molecular beam epitaxy (MBE), or the like.

Process block 303 illustrates growing an n-type epitaxial layer (e.g. second doped semiconductor layer 103) on the p-type epitaxial layer. The n-type epitaxial layer may include a semiconductor such as silicon, germanium, or the like. During the growth process, dopant atoms are deposited at the same time as the semiconductor source material and therefore a subsequent step of ion implantation of dopant into the n-type epitaxial layer is not required. In one example, dopant atoms include arsenic, or phosphorus. The n-type epitaxial layer may be fabricated using chemical vapor deposition (CVD), atomic layer deposition (ALD), molecular beam epitaxy (MBE), or the like. Growing the first and second doped semiconductor layers to form the multiplication junction (rather than using ion implantation) results in the formation of a high quality multiplication junction with minimal crystallographic defects, in accordance with the teachings of the present invention.

In process block 305, front end masking operations and implantation steps (for doped contact and guard ring regions) are shown. Front end masking operations and implantation steps may include forming a doped contact region (e.g. doped contact region 107) and forming a guard ring region (e.g. guard ring region 109) in the second semiconductor layer. The doped contact region is of the same majority charge carrier type as the second semiconductor layer (e.g. n-type), whereas the guard ring region is of an opposite majority charge carrier type as the second semiconductor layer (e.g. p-type).

In one example, both the doped contact region and the guard ring region are formed using ion implantation steps. N-type dopant atoms such as arsenic or phosphorus may be implanted to form the doped contact region. It should be noted that the dopant concentration in the n-type doped contact region will likely be higher than that in the second semiconductor layer. Conversely, p-type dopant atoms such as boron may be used to form the guard ring region. In one example, the guard ring region may include a second doped contact region (e.g. second doped contact region 111), which is of the same majority charge carrier type (e.g. p-type) as the guard ring region but has a greater dopant concentration than the guard ring region.

Process block 307 details flipping the diode wafer (e.g. substrate 271) and bonding the second doped semiconductor layer to a logic wafer (e.g. logic wafer 121). Electrical interconnects are contained in the logic wafer and may be bonded to individual SPADs. In one example, logic wafer 221 includes control circuitry (e.g. control circuitry 420) and readout circuitry (e.g. readout circuitry 410).

In process block 309, the p-type epitaxial layer (e.g. first doped semiconductor layer 101) is thinned. Thinning includes removing material from the first doped semiconductor layer such that it becomes a thickness that is less than an original thickness. Therefore, photons incident on a multiplication junction defined at an interface between first doped semiconductor layer 201 and second doped semiconductor layer 203 are converted to a measurable electric charge.

Although not depicted, in one example, passivation of the p-type epitaxial layer may occur and may be achieved by high dose implant or charged oxide growth in/on the p-type epitaxial layer. This may help to reduce dark current and subsequent image noise.

Process block 311 teaches processing the optical stack, which may include forming an antireflection coating (e.g. antireflection coating 131), a color filter layer (e.g. color filter layer 141), and microlenses (e.g. microlens layer 151). The antireflection coating may be formed on a first doped semiconductor layer (e.g. first doped semiconductor layer 101). The microlenses may be fabricated proximate to the antireflection coating, such that the antireflection coating is disposed between the first doped semiconductor layer and the microlenses. In one example, the color filter layer may also be formed such that the color filter layer is disposed between the antireflection coating and the microlenses.

Figure 4:
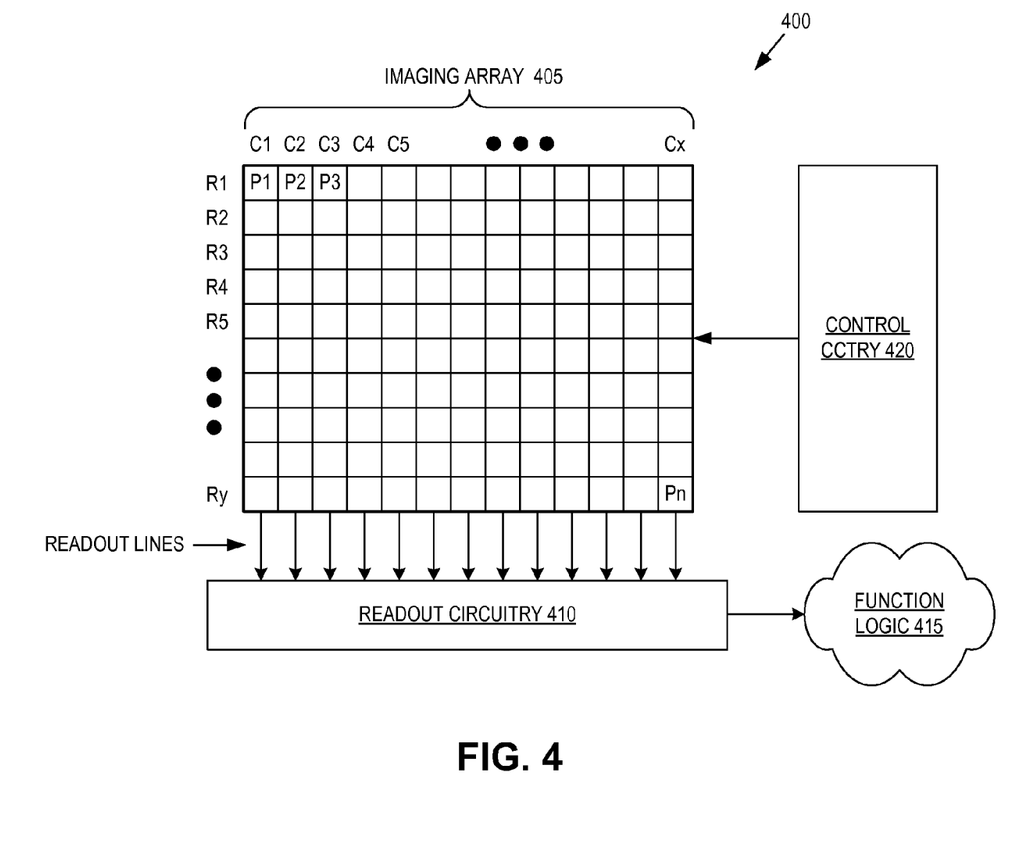
FIG. 4 is a block diagram illustrating one example of a SPAD image sensor system, in accordance with the teachings of the present invention.

FIG. 4 is a block diagram illustrating one example of a SPAD image sensor system 400 (hereinafter "image sensor system 400"), in accordance with the teachings of the present invention. Image sensor system 400 may be one example implementation of the integrated circuit system illustrated in FIG. 1. The illustrated example of image sensor system 400 shown in FIG. 4 includes a SPAD imaging array 405, high speed readout circuitry 410, function logic 415, and control circuitry 420.

As shown in the depicted example, imaging array 405 is a two-dimensional ("2D") array of imaging sensors or avalanche photodiode pixels (e.g. pixels P1, P2, Pn). In one example, imaging array 405 is an example of image sensor 100 depicted above in FIGS. 1-3. In one example, each pixel includes a SPAD region that is adapted to be illuminated from the back side and includes a thin p epitaxial layer that is formed on the back side over a thicker n epitaxial layer to define the multiplication junction of each SPAD region in accordance with the teachings of the present invention. As illustrated in the depicted example, each pixel is arranged into a row (e.g. rows R1 to Ry) and a column (e.g. column C1 to Cx) to acquire image data of a person, place, or object, which can then be used to render a 2D image of the person, place, or object. Imaging array 405 may also be used in timing mode to give a "time image" of a scene, which may be used in time of flight applications for range information or fluorescence lifetime for medical applications.

Output pulses generated by the SPAD regions of imaging array 405 are read out by readout circuitry 410 and transferred to function logic 415. Readout circuitry 410 is coupled to readout image data from the plurality of avalanche photodiode pixels and may include at least one digital counter for each of the SPAD regions. Readout circuitry 410 can also include amplification circuitry and/or quenching circuitry. Function logic 415 may be coupled to readout circuitry 410, to store image data read out from the plurality of avalanche photodiode pixels. Function logic 415 can simply store image data in memory or even manipulate the image data by applying post image effects (e.g. crop, rotate, remove red eye, adjust brightness, adjust contrast, or otherwise). Control circuitry 420 is coupled to imaging array 405 and/or readout circuitry 410 to control operational characteristics of the plurality of avalanche photodiodes. For example, control circuitry 420 may simultaneously enable each of the digital counters included in high speed readout circuitry 410 for a window of time so as to implement a global shutter operation. Accordingly, examples of the SPAD stacked chip image sensor, discussed herein, provide for imaging that is both high speed and low light sensitive, and may be used in variety of applications, such as for example but not limited to, time of flight sensors, fluorescence lifetime sensors, or any other SPAD applications, which are typically not achieved with conventional sensor architectures.

In one example, image sensor system 400 may be included in a digital camera, cell phone, laptop computer, or the like. Additionally, image sensor system 400 may be coupled to other elements of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware may deliver instructions to image sensor system 400, extract image data from image sensor system 400, or manipulate image data supplied by image sensor system 400.

Figure 5:
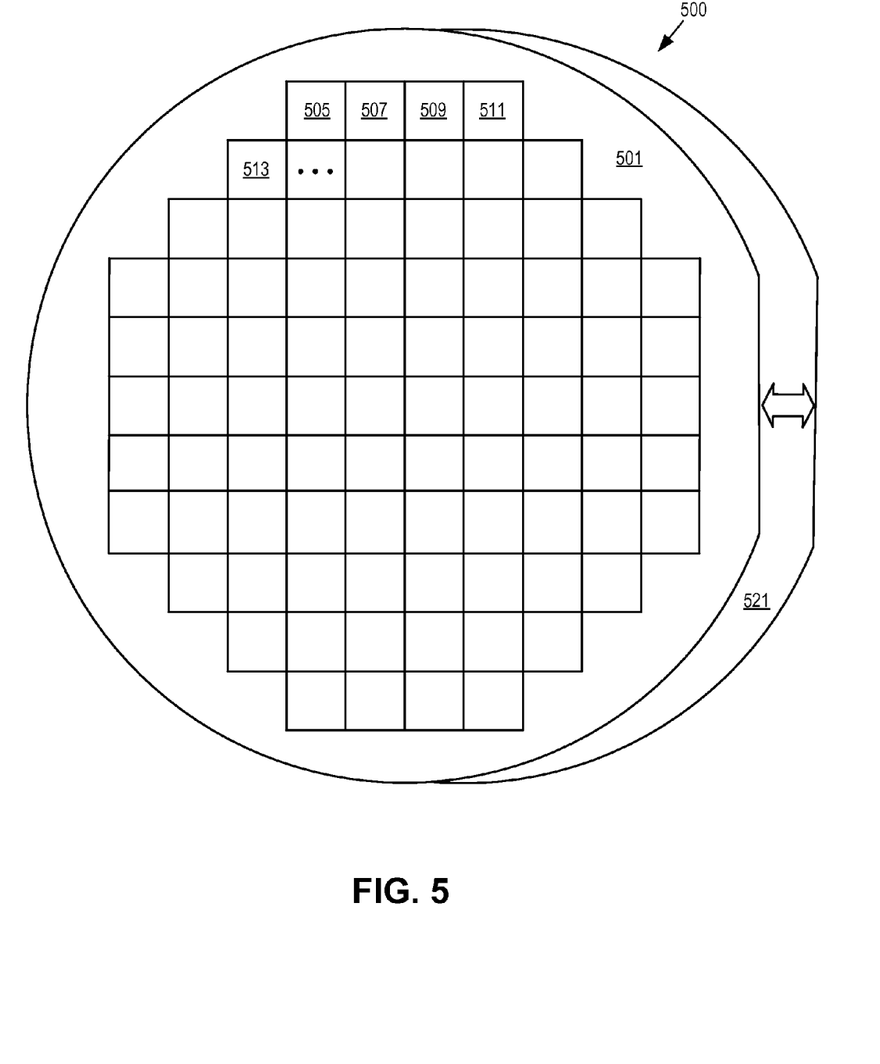
FIG. 5 is an exploded view of one example of stacked semiconductor wafers with integrated circuit dies of an example SPAD imaging sensor system, in accordance with the teachings of the present invention.

FIG. 5 is an exploded view 500 of one example of stacked semiconductor wafers with integrated circuit dies of an example SPAD imaging sensor system, in accordance with the teachings of the present invention. In one example, image sensor wafer 501 includes a plurality of imaging arrays including an imaging array 505. In one example, imaging array 505 may be an example of imaging array 405. In the illustrated example, image sensor wafer 501 includes semiconductor dies with imaging arrays fabricated in/on them (e.g. imaging arrays 505-513) while logic wafer 521 includes corresponding semiconductor dies (view obscured in FIG. 5). In some examples, each imaging array 505-513 of image sensor wafer 501 may include an array of SPAD pixels, while each corresponding die of logic wafer 521 may include CMOS circuitry including, for example, control circuitry, readout circuitry, function logic, and digital counters. Image sensor wafer 501 is formed separately from logic wafer 521. Accordingly, custom fabrication processes may be utilized to optimize the formation of the SPAD regions in the SPAD array on image sensor wafer 501, while traditional CMOS processes may be retained when forming the CMOS circuitry on the logic wafer 521, in accordance with the teachings of the present invention.

In another example, it is appreciated that one or more additional semiconductor wafers may also be stacked with the two stacked wafers 501 and 521 illustrated in FIG. 5. For instance, it is noted that an additional wafer, including for example dynamic random access memory (DRAM), may be coupled to image sensor wafer 501 and logic wafer 521 in accordance with the teachings of the present invention.

In one example, after forming the first doped semiconductor layer (e.g. first doped semiconductor layer 101), the second doped semiconductor layer (e.g. second doped semiconductor layer 103), the doped contact region (e.g. doped contact region 107), and the guard ring region (e.g. guard ring region 109) in image sensor wafer 501, image sensor wafer 501 is attached to logic wafer 521. In another or the same example, individual SPADs are connected to logic wafer 521 via electrical interconnects. The electrical interconnects may include metal or semiconductor materials.

In one example, after logic wafer 521 is attached to image sensor wafer 501, a substrate (e.g. substrate 271) is removed from the first doped semiconductor layer (e.g. first doped semiconductor layer 101), and the first doped semiconductor layer is thinned (see FIGS. 2D-2E).

Figure 6:
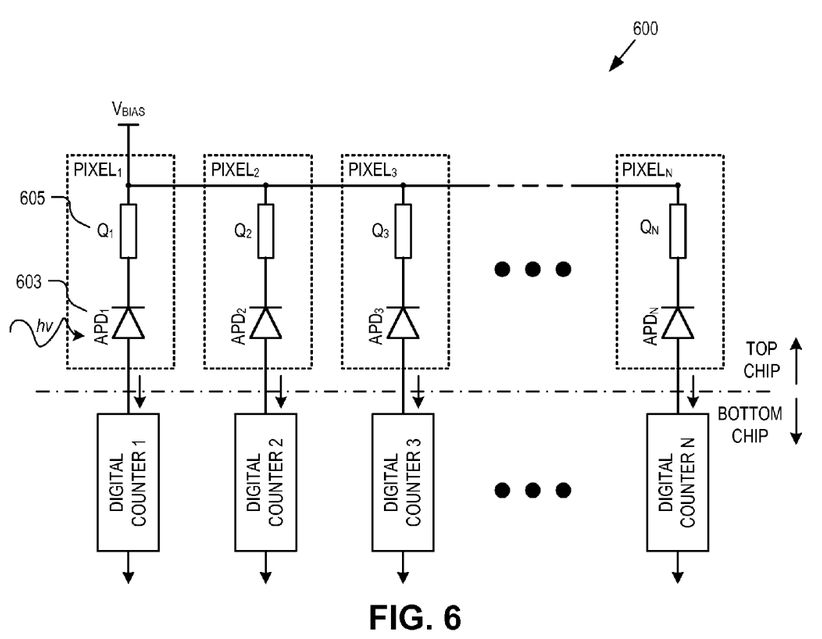
FIG. 6 is a circuit diagram illustrating one example of a stacked chip SPAD imaging sensor system including quenching elements, in accordance with the teachings of the present invention.

FIG. 6 is a circuit diagram 600 illustrating one example of a stacked chip SPAD imaging sensor system including quenching elements 605, in accordance with the teachings of the present invention. It is noted that the pixel circuitry illustrated in FIG. 6 (e.g., PIXEL$_1$, PIXEL$_2$, ... PIXEL$_N$) is one possible example of a SPAD pixel circuitry architecture for implementing each pixel with an imaging array. In the example depicted in FIG. 6, pixels PIXEL$_1$ through PIXEL$_N$ are illustrated as being arranged in a single row. However, in other examples, it is appreciated that pixels of an imaging array may be arranged into a single column, or into a two-dimensional array of columns and rows.

As shown in FIG. 6, each example pixel includes a SPAD (e.g., SPAD$_1$-SPAD$_N$) coupled to a respective quenching element (e.g., quenching elements Q$_1$-Q$_N$) disposed in a top chip of a stacked chip system. In the illustrated example, it is noted that each SPAD includes thin p epitaxial layer that is formed on the back side over a thicker n epitaxial layer to design the multiplication junction in accordance with the teachings of the present invention. In various examples, it is also noted that the example quenching elements $Q_1$-$Q_N$ that are coupled to each respective $SPAD_1$-$SPAD_N$ may be included in the top chip (e.g. image sensor wafer 501) or the bottom chip (e.g. logic wafer 521) in accordance with the teachings of the present invention. It is also appreciated that example quenching elements $Q_1$-$Q_N$ may be implemented using passive or active quenching elements in accordance with the teachings of the present invention. Quenching elements 605 may be coupled to the individual pixels (including photodiode 603) in the plurality of avalanche photodiode pixels to quench avalanching by lowering a bias voltage.

In operation, each $SPAD_1$-$SPAD_N$ is reverse biased via a bias voltage $V_{BIAS}$ that is above the breakdown voltage of each $SPAD_1$-$SPAD_N$. In response to a single photogenerated carrier generated at the multiplication junction, an avalanche multiplication process is triggered that causes an avalanche current at the output of each $SPAD_1$-$SPAD_N$. This avalanche current self-quenches in response to a voltage drop that is developed across the quenching element (e.g., $Q_1$-$Q_N$), which causes the bias voltage across the SPAD to drop. After the quenching of the avalanche current, the voltage across the SPAD recovers to above the bias voltage and then the SPAD is ready to be triggered again. In one example, the resulting output pulse of each $SPAD_1$-$SPAD_N$ may be received by a respective digital counter 1-N, which increments its count in response thereto. In another example, the resulting output pulse of each SPAD i-$SPAD_N$ may be received by timing circuitry in accordance with the teachings of the present invention.

The above description of illustrated examples of the invention, including what is described in the Abstract, is not intended to be exhaustive or to limit the invention to the precise forms disclosed. While specific example of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific example s disclosed in the specification. Rather, the scope of the invention is to be determined entirely by the following claims, which are to be construed in accordance with established doctrines of claim interpretation.

What is claimed is:

1. A method of fabricating an avalanche photodiode pixel, the method comprising:
    growing a second doped semiconductor layer on a first doped semiconductor layer having a first doping concentration, wherein the second doped semiconductor layer is grown with a second doping concentration, and wherein the second doped semiconductor layer is of an opposite majority charge carrier type as the first doped semiconductor layer;
    forming a doped contact region having a third doping concentration in the second doped semiconductor layer, wherein the second doped semiconductor layer is disposed between the doped contact region and the first doped semiconductor layer, and wherein the doped contact region is of a same majority charge carrier type as the second doped semiconductor layer, and wherein the third doping concentration is greater than the second doping concentration; and
    forming a guard ring region in the second doped semiconductor layer, wherein the guard ring region is of an opposite majority charge carrier type as the second doped semiconductor layer, and wherein the guard ring region extends entirely through the second doped semiconductor layer and surrounds the doped contact region.

2. The method of claim 1, further comprising attaching a logic wafer to the second doped semiconductor layer, wherein the second doped semiconductor layer is disposed between the first doped semiconductor layer and the logic wafer.

3. The method of claim 1, further comprising thinning the first doped semiconductor layer to a thickness that is less than an original thickness, wherein the thickness is such that photons incident on a multiplication junction defined at an interface between the first doped semiconductor layer and the second doped semiconductor layer are converted to a measurable electric current.

4. The method of claim 1, further comprising:
    forming an antireflection coating disposed on the first doped semiconductor layer; and
    forming a microlens layer, wherein the antireflection coating is disposed between the first doped semiconductor layer and the microlens layer.

5. The method of claim 4, further comprising forming a color filter layer, wherein the color filter layer is disposed between the antireflection coating and the microlens layer.

6. The method of claim 1, wherein the first doped semiconductor layer is p-type, the second doped semiconductor layer is n-type, and the doped contact region is n-type.

7. The method of claim 1, wherein the first doped semiconductor layer is n-type, the second doped semiconductor layer is p-type, and the doped contact region is p-type.

8. The method of claim 1, wherein the guard ring region is separated from the doped contact region in the second doped semiconductor layer by a lateral distance.

9. The method of claim 1, further comprising forming a second doped contact region within the guard ring region, wherein the second doped contact region is of a same majority charge carrier type as the guard ring region, and wherein a doping concentration of the second doped contact region is greater than a doping concentration of the guard ring region.

10. The method of claim 1, wherein the first and second doped semiconductor layers are formed by epitaxial growth, and wherein the first and second doped semiconductor layers are grown on a substrate.

11. A method of image sensor system fabrication, the method comprising:
    forming a first doped semiconductor layer on a substrate, wherein the first doped semiconductor layer is grown with a first doping concentration;
    forming a second doped semiconductor layer on the first doped semiconductor layer, wherein the second doped semiconductor layer is grown with a second doping concentration, and wherein the second doped semiconductor layer is of an opposite majority charge carrier type as the first doped semiconductor layer;
    forming a plurality of avalanche photodiode pixels, wherein the plurality of avalanche photodiode pixels include a doped contact region disposed in the second doped semiconductor layer, and wherein the doped contact region is of a same majority charge carrier type as the second doped semiconductor layer and has a greater doping concentration than the second doped semiconductor layer;
    forming a guard ring region which extends entirely through the second doped semiconductor layer, wherein the guard ring region is of an opposite majority charge carrier type as the second doped semiconductor layer, and wherein the guard ring region separates individual pixels in the plurality of avalanche photodiode pixels; and connecting a logic wafer to the second doped semiconductor layer, wherein the second doped semiconductor layer is disposed between the logic wafer and the first doped semiconductor layer.

12. The method of claim 11, further comprising:
forming an antireflection coating disposed on the first doped semiconductor layer; and
forming a microlens layer, wherein the antireflection coating is disposed between the first doped semiconductor layer and the microlens layer.

13. The method of claim 12, further comprising forming a color filter layer, wherein the color filter layer is disposed between the antireflection coating and the microlens layer.

14. The method of claim 11, further comprising forming control circuitry and readout circuitry, wherein the control circuitry is coupled to control operation of the plurality of avalanche photodiode pixels, and wherein the readout circuitry is coupled to readout image data from the plurality of avalanche photodiode pixels.

15. The method of claim 14, further comprising forming function logic coupled to the readout circuitry, to store image data read out from the plurality of avalanche photodiode pixels.

16. The method of claim 14, wherein the logic wafer includes the control circuitry and the readout circuitry.

17. The method of claim 11, wherein the plurality of avalanche photodiode pixels are arranged into an imaging array comprising rows and columns.

18. The method of claim 11, further comprising removing the substrate and thinning the first doped semiconductor layer to a thickness that is less than an original thickness, wherein the thickness is such that photons incident on a multiplication junction defined at an interface between the first doped semiconductor layer and the second doped semiconductor layer are converted to a measurable electric charge.

19. The method of claim 11, further comprising forming a quenching element coupled to the individual pixels in the plurality of avalanche photodiode pixels to quench avalanching by lowering a bias voltage.

20. The method of claim 11, further comprising forming a second doped contact region within the guard ring region, wherein the second doped contact region is of a same majority charge carrier type as the guard ring region, and wherein a doping concentration of the second doped contact region is greater than a doping concentration of the guard ring region.

21. The method of claim 11, wherein the first and second doped semiconductor layers are formed by epitaxial growth.

22. The method of claim 11, wherein the substrate comprises one of silicon, silicon oxide, metal oxide, SiGe, Ge, or InGaAsP.

23. The method of claim 11, wherein the first semiconductor layer is passivated by dopant implantation in the first semiconductor layer or by growth of a charged oxide layer on the first semiconductor layer.

* * * * *